United States Patent
Ishihara

(10) Patent No.: US 6,249,267 B1
(45) Date of Patent: Jun. 19, 2001

(54) DISPLAY APPARATUS HAVING HEAT DISSIPATION

(75) Inventor: Takayuki Ishihara, Kyoto (JP)

(73) Assignee: Rohm Co., LTD, Kyoto (JP)

(*) Notice: Subject to any disclaimer, the term of this patent is extended or adjusted under 35 U.S.C. 154(b) by 0 days.

(21) Appl. No.: 08/802,264

(22) Filed: Feb. 19, 1997

(30) Foreign Application Priority Data

Feb. 19, 1996 (JP) .................................................. 8-030512

(51) Int. Cl.[7] .................................................. G09G 3/32
(52) U.S. Cl. ................................................. 345/82; 345/80
(58) Field of Search ...................... 345/80, 82; 313/503, 313/498; 315/169.3

(56) References Cited

U.S. PATENT DOCUMENTS

| | | | |
|---|---|---|---|
| 5,156,924 | * | 10/1992 | Taniguchi et al. ............... 428/690 |
| 5,206,749 | * | 4/1993 | Zavracky et al. ................ 349/45 |
| 5,277,724 | * | 1/1994 | Prabhu ........................... 324/307 |
| 5,336,879 | * | 8/1994 | Sauer ............................. 250/208.1 |
| 5,371,510 | * | 12/1994 | Miyauchi et al. ............... 345/9 |
| 5,378,963 | * | 1/1995 | Ikeda ............................. 313/495 |
| 5,384,517 | * | 1/1995 | Uno ............................... 315/169.3 |
| 5,442,808 | * | 8/1995 | Kerkhof ......................... 445/41 |
| 5,529,852 | * | 6/1996 | Sesame et al. ................. 428/620 |
| 5,608,290 | * | 3/1997 | Hutchisson et al. ........... 315/200 A |
| 5,644,327 | * | 7/1997 | Onyskevych et al. .......... 345/80 |
| 5,656,548 | * | 8/1997 | Zavracky et al. .............. 438/23 |
| 5,785,418 | * | 7/1998 | Hochstein ...................... 362/373 |
| 5,976,953 | * | 11/1999 | Zavracky et al. .............. 438/455 |
| 5,994,204 | * | 11/1999 | Young et al. .................. 438/455 |

* cited by examiner

Primary Examiner—Amare Mengistu
(74) Attorney, Agent, or Firm—Arent Fox Kintner Plotkin & Kahn PLLC

(57) ABSTRACT

Disclosed is a display apparatus comprising a printed board mounting on one surface with light elitting elements in a matrix form and on the other surface with control components for controlling the drive for the light emitting elements. The printed board is formed by a heat conductive substrate of such as a metal plate and electrically insulative members formed on respective surfaces thereof. The printed board is electrically insulative at the respective surfaces but excellent in heat conductivity. Accordingly, the printed board provided is excellent in heat conductivity so that heat developed by the light emitting elements or control components can be dissipated outside with high efficiency. There is no necessity of reducing driving electric power to low or no fear of incurring degradation of the components or display characteristics.

7 Claims, 3 Drawing Sheets

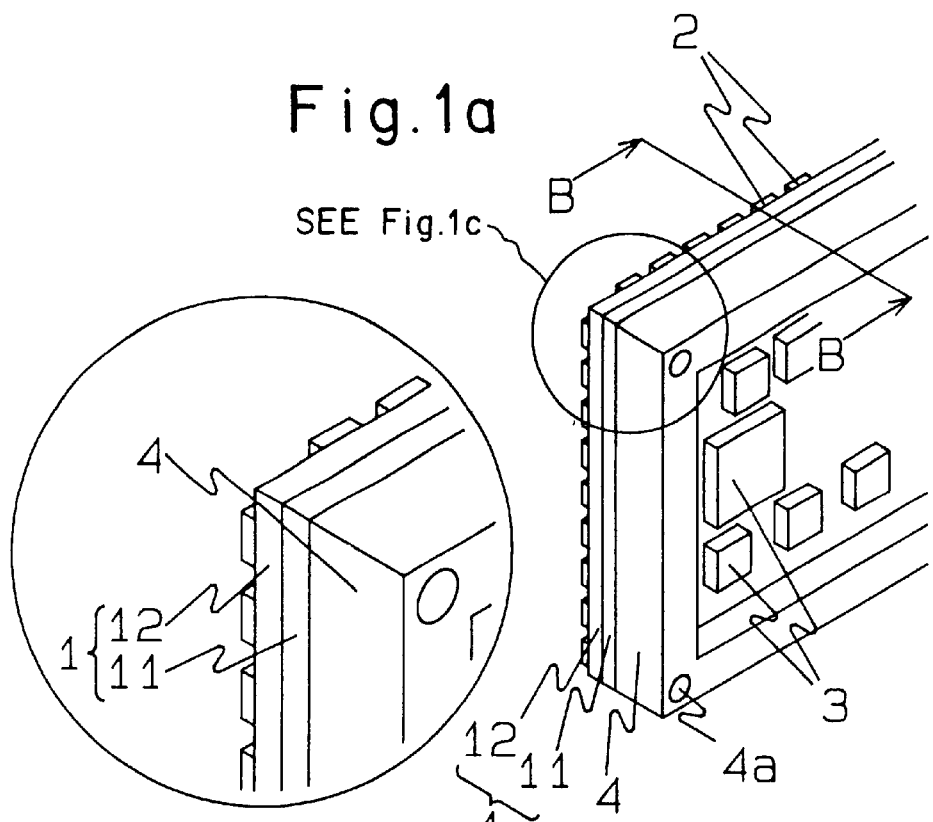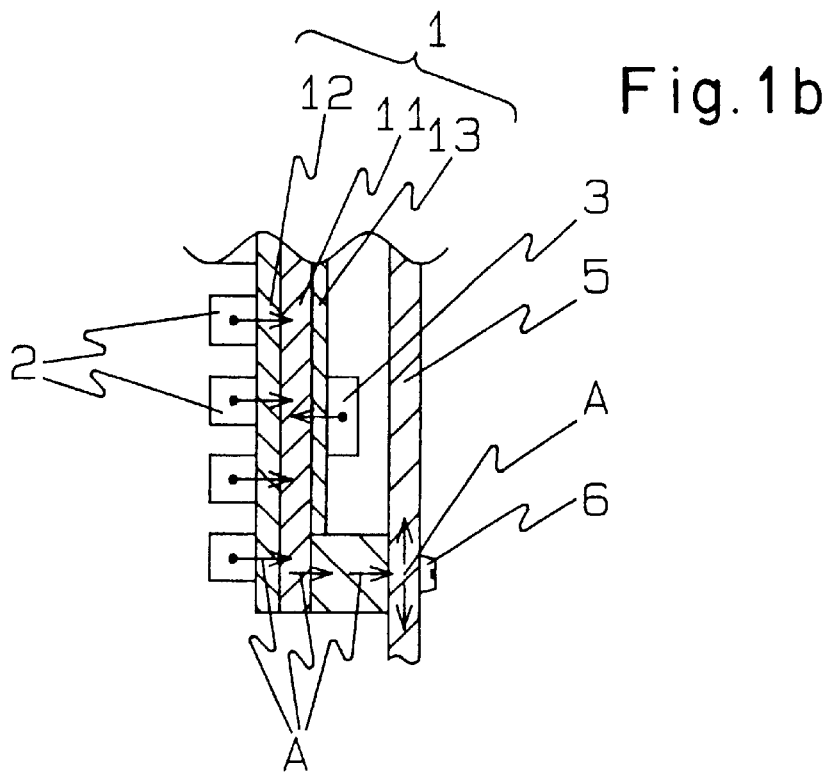

DISPLAY APPARATUS HAVING HEAT DISSIPATION

BACKGROUND OF THE INVENTION

This invention relates to display apparatuses which have light emitting elements arranged in a matrix form on a printed substrate so that the light emitting elements are individually turned on and off to display images such as characters, and more particularly to display apparatuses which is adapted to dissipate heat developed by electronic components such as light emitting elements mounted on a printed board.

Conventionally, there have been utilized display apparatuses involving information display boards installed at railway stations or public squares as well as inside displays provided in vehicular rooms. These display apparatuses have light emitting elements such as light emitting diodes (hereinafter referred to as LEDs) in a matrix form so that the LEDs are individually controlled of emission of light to display characters and so on for displaying information of news, time, temperature, etc. The display apparatus of this kind has a structure for example as shown in FIG. 4

In FIG. 4, 1 is a printed board formed of a glass-epoxy resin or the like having interconnect patterns on opposite surfaces. The printed board 1 has chip LEDs 2 matrix-arranged on one surface and IC components (controlling components) 3 matrix-arranged on the other surface. The IC components comprise controlling and driving components for selectively turning on and off the LEDs 2 on the opposite side. 4 is a metal fixture for fixing the display apparatus on an assembly on which the display apparatus is installed without being interfered by the IC components. The display apparatus is mounted on a housing, etc., of such an assembly by fastening screws in attachment holes 4a.

The printed board 1 on which LEDs 2 and IC components 3 are thus mounted is formed by an electrically insulative substrate such as a glass-epoxy resin substrate formed with interconnect patterns on the surfaces thereof. To mount LEDs and IC components on the printed board 1, surface mounting is usually adopted wherein these parts are rested on a surface of the printed board 1 to directly solder lead wires or electrode terminals of these parts onto the interconnect pattern on the printed board 1. In such cases, the connection between LEDs 2 and IC components 3 is carried out via through-holes formed in the printed board 1 or by way of lateral faces of the printed board 1.

The technique of mounting electronic components on a electrically insulative printed board for electronic assemblies is being applied to various electronic devices and apparatuses. In recent, the surface mounting that electronic components are directly soldered on the surface of a printed board is becoming a main stream in the field of mounting electronic devices and apparatuses.

Where electronic components are mounted on a electrically insulative printed board, there is almost no problem for small consumption power of electronic components. On the contrary, where mounting with LEDs for large-sized displays as stated hereinbefore or a number of heat-dissipating electronic components such as high-power semiconductor devices, the heat generated from the components is difficult to dissipate outside because of poor heat conductivity of such an electrically insulative printed board. The remaining heat is accumulated in the insulative substrate to thereby raise the temperature of electronic components, badly influencing electrical characteristics of the display apparatus. To avoid this, there is necessity of reducing the operating power low to suppress heat development, making difficult to provide a sufficient level of brightness of light.

SUMMARY OF THE INVENTION

It is therefore the object of the present invention to solve the above stated problem and provide a display apparatus which is capable of efficiently dissipate heat developed by electronic components to the outside to suppress excessive heating of the temperature of the components, thereby preventing against lowering in display characteristics.

A display apparatus of the present invention comprising: a heat conductive substrate; electrically insulative members formed on respective surfaces of the heat conductive substrate; light emitting elements arranged in a matrix form on the surface of the electrically insulative member on one surface of the heat conductive substrate; and control components arranged on the surface of the electrically insulative member on the other surface of the heat conductive substrate.

Here, the light emitting element refers to as an electronic element such as an LED for radiating light, which involves a bare chip per se divided by a semiconductor substrate and light-source arrays formed on a substrate. The heat conductive substrate means substrate in which the heat conductivity is obviously higher than that of a conventional printed board formed of glass-epoxy resin.

With such structure, the heat generated from light emitting elements or controlling components is allowed to conduct through the conductive substrate to be dissipated to the outside. Accordingly, the temperature of the electronic components such as light emitting elements is prevented from rising to an excessively high temperature, and accordingly there is substantially no necessity of lowering the driving electric power for the electronic component.

Preferably, the electrically insulative member on the one surface is formed at least two layers of a first under layer and a second layer formed thereon, the first layer having an interconnect pattern formed on a surface thereof, the second layer being formed with blind through-holes through which the light emitting elements and the interconnect pattern are electrically connected. With such arrangement, the light emitting elements are arranged with high density on the upper second layer, i.e., on a light emitting side of the display apparatus, with interconnects therefore provided on the first layer, thereby improving display characteristics of the display apparatus.

Here, the blind through-hole means a through hole formed penetrating a layer or a part of layers in a plurality of layers provided as an electrically insulating member, and does not mean a through-hole penetrating the entire layers thereof.

More preferably, at least one of the electrically insulative members are partly removed to provide exposed surface to the heat conductive substrate. With such arrangement, the heat built up in the heat conductive substrate is to be released to the outside.

Further preferably, the heat conductive substrate has a metal fixture on the other surface thereof, the metal fixture being in contact with the exposed surface of the heat conductive substrate, and the metal fixture has a height higher than those of the control components. If so arranged, where the display apparatus is installed on a housing of external apparatus or device, connection is possible through the metal fixture between the heat conductive substrate and the housing. This connection provides formation of a path for heat conduction from the electronic components, such as light emitting elements or controlling components, as a heat source to the housing for dissipating heat. Thus, the heat if developed is efficiently dissipated to the outside.

Still further preferably, the metal fixture is formed by a sheet member, and the metal fixture includes an attaching portion projecting higher than the control component. The metal fixture is readily available with less material. In such cases, the sheet member may have a stepped portion formed projecting to be contacted with the exposed surface of the heat conductive substrate.

Preferably, the heat conductive substrate is formed of alumina having an interconnect pattern on the one surface thereof, the electrically insulative member on the one surface being formed with blind through-holes through which the light emitting elements and the interconnect pattern are in electrical connection. If so constructed, a multi-layer structure is also available in compact with using the heat conductive substrate and the electrically insulative members, providing effects similarly to the aforementioned structure.

For a fuller understanding of the nature and advantages of the invention, reference should be made to the ensuing detailed description taken in conjunction with the accompanying drawings.

BRIEF DESCRIPTION OF THE DRAWINGS

FIG. 1(a) and FIG. 1(c) are perspective explanatory views of a display apparatus of the present invention and FIG. 1(b) is a partial cross-sectional view of the same;

DETAILED DESCRIPTION OF THE INVENTION

Figure 4:
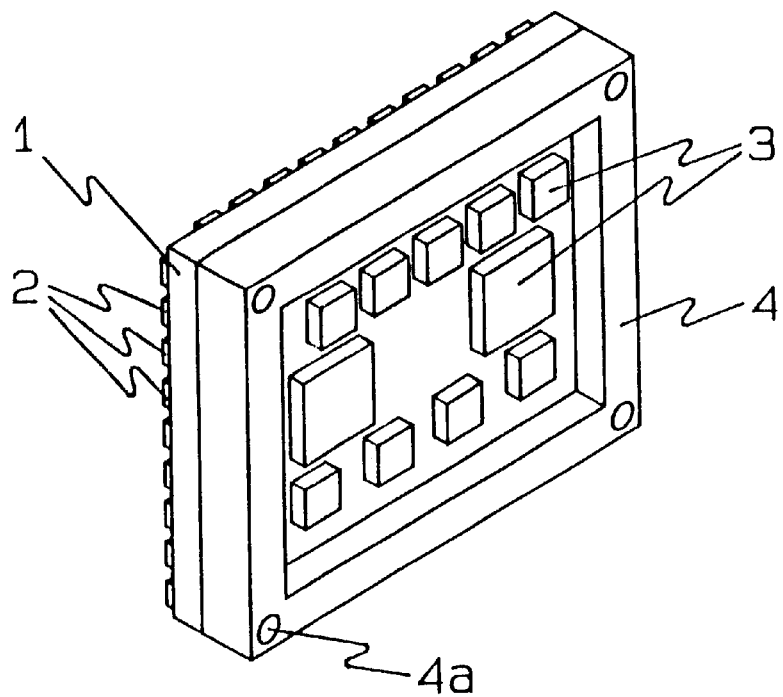
FIG. 4 is a perspective explanatory view of a display apparatus using the conventional circuit board.

The present invention will then be explained with reference to the drawing. FIG. 1(a) is a perspective view of a display apparatus according to the present invention, and FIG. 1(b) is an explanatory cross-sectional view taken along the line B—B in FIG. 1(a). Note that in FIG. 1(a) the members denoted by reference characters 5 and 6 in FIG. 1(b) are not shown. In FIGS. 1(a) to 1(b), there is shown a printed board 1 having LEDs 2 arranged in a matrix form on one surface thereof. The printed board 1 has a metal fixture 4 at the other surface thereof, on which surface are mounted IC components (control components) 3 for control of light emission by the LEDs. The IC components 3 involve control ICs and driving ICs for the LEDs. The metal fixture 4 has mounting holes 4a similarly to the example of FIG. 4.

The printed board 1 of the invention is of a sandwich structure formed by a heat conductive substrate 11 as a core member and electrically insulative members 12, 13 provided on respective surfaces thereof. The heat conductive substrate 11 is formed for example by a metal plate, whereas the insulative members are formed by a glass-epoxy resin substrate or an organic resin film such as a polyimide film.

The materials for the heat conductive substrate involve metallic materials such as aluminum, copper, and stainless steel, or otherwise as non-metallic materials alumina, or a silicon-composite plate. These materials are high in heat conductivity as compared with the conventional glass-epoxy. Incidentally, where the heat conductive substrate has a property also as an electrical insulator, there may be no requirement of seperately providing electrical insulative members thereon. Note that the member denoted by numeral 6 is a screw for attaching the metal fixture 4 to a housing 5 of an external apparatus onto which the display apparatus of the invention is to be installed. The housing 5 and the screw 6 are not demonstrated in FIG. 1(a).

To fabricate a printed board 1, first prepared a metal plate 11 of aluminum. Through-holes are formed penetrating through the metal plate 11, which enables electrical connection between LEDs on one side and IC components on the other side. Then a polyimide resin is applied over entire surfaces of the metal plate 11 including the main and back surfaces and side surfaces, and then cured so as to provide electrically insulative member 12, 13 on the respective surfaces thereof. Thereafter, copper films are deposited over the main and back surfaces, in a manner similar to the manufacture of the ordinary printed board. The copper films thus formed are then etched and patterned into interconnect patterns.

Figure 2:
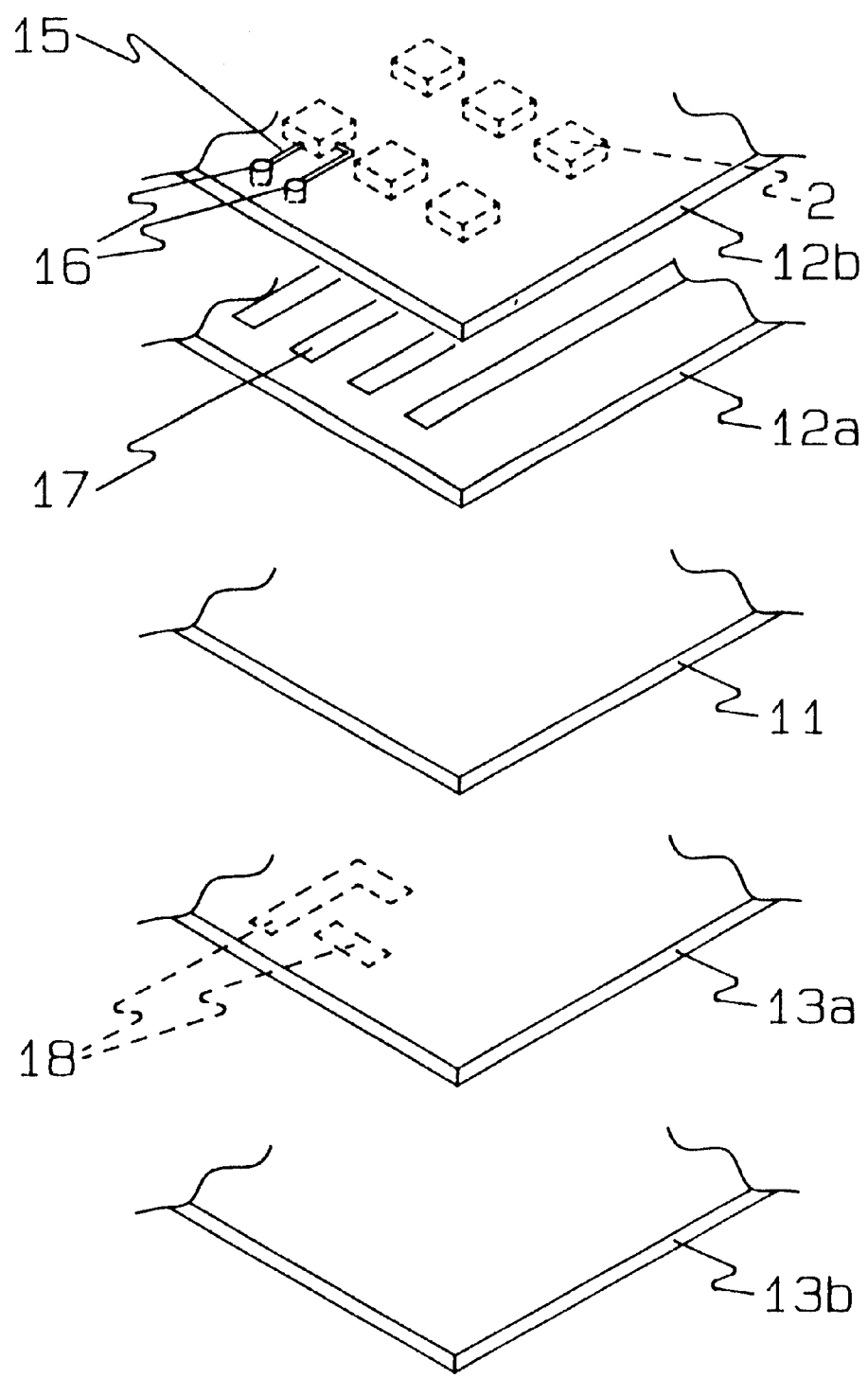
FIG. 2 is an exploded explanatory view of the display apparatus of the present invention, showing another structural example of a printed board.

FIG. 2 shows another example of forming a printed board of the present invention, wherein the printed board 1 is demonstrated as an exploded perspective view. As shown in the figure, electrically insulative members 12 (12a, 12b), 13 (13a, 13b) are formed of a glass-epoxy resin. The electrically insulative members 12, 13 are respectively bonded onto main and back surfaces of the metal plate 11. In this example, the electrically insulative members each comprise two layers of insulative plates. However, the electrically insulative member may alternatively be of one single layer, or three or more layers.

In this example, the metal plate 11 is an aluminum plate having a thickness of 0.6 to 0.7 mm. On one surface of the metal plate 11, a first layer 12a and a second layer 12b are bonded in the order through the use of an epoxy-based adhesive. The first and second layers each have a thickness of 0.2 to 0.3 mm. Incidentally, where electrical connection is carried out via through-holes formed in the metal plate 11, it is preferred that the inner surface of the trough-hole is coated with an insulative film in advance. The first layer 12a has on the surface thereof a copper interconnect pattern 17 for supplying electric current to the LEDs 2 mounted on the surface of the second layer 12b. The electrical connection between the interconnect pattern 17 on the first layer 12a and the LEDs 2 on the second layer 12b are made through the utilization of blind through-holes 16 formed in the second layer 12b. The blind through-holes 16 penetrates through only the second layer 12b, instead of the entire layers superposed. The two-layer structure of the electrical insulative members 12 allows the LEDs 2 to be arranged at a narrower interval free from restriction by the interconnect pattern, being contributable to the improvement on the quality of display. The blind through-holes combined with the interconnect pattern minimize the number of through-holes required in the metal plate 11. With such structure, if heat is developed by the LEDs, the heat conducts through the blind through-holes 16 and the interconnect pattern and to the metal plate 11 where it is dissipated to the outside. On the IC component mounting side, on the other hand, the electrically insulative member is also formed by two layers of a first layer 13a and a second layer 13b. If an interconnect pattern 18 on a surface of the first layer 13a is provided in combination with blind through-holes in the second layer 13b, the aforesaid effect will be also available similarly.

As will be understood from the above, the core portion of the printed board 1 is formed by the metal plate 11 in direct contact with the interconnect pattern so that the heat developed by the electronic components is released to the metal plate 11 and dissipated through the entirety of the printed board 1. However, if the printed board 1 is mounted on a housing 5 of an other external apparatus by using a heat conductive metal fixture 4 so as to be in contact with the metal plate 11, the heat is released through the fixture 4 and the housing 5. The metal plate 11, if formed of aluminum, has high heat conductivity, that is, approximately 3 to 5 times higher than the conventionally used insulative substrate. Therefore, the heat developed by the the LEDs 2 and the ICs component 3 conducts through the blind through-hole and the interconnect pattern on an interlayer, and readily dissipates to the entirety of the metal plate 11. In this manner, the electronic components are prevented from being overheated, and there is almost no requirement of restricting applying electric power supplied to these components while preventing against unstable operation of the components due to excessive rising in operating temperature.

Meanwhile, since the respective surfaces of the printed board 1 is covered by the electrically insulative members 12, 13, interconnect patterns can be easily formed by the conventional technique, e.g. depositing and etching a copper film into an interconnect patterns and thereafter mounting LEDs 2 or IC components 3 to complete circuits. Incidentally, although the the LEDs 2 mounted on one side of the printed board 1 are electrically connected to the driving circuit comprising the IC components 3 mounted on the other side, the electrical connection therebetween is via through-holes penetrating the metal plate 11. Alternatively, the electrical connection may be by way of lateral faces of the printed board 1 by providing interconnects on these faces.

Referring back to FIG. 1, the electrically insulative member 13 on the IC components 3 side is removed away along the entire periphery thereof, so that the metal fixture 4 is attached in direct contact with the metal plate 11. In this example, the metal fixture 4 has a height greater than the IC components 3. By doing so, where the printed board is installed on the housing 5 of an external assembly, the heat developed will conduct through the metal fixture 4 toward the housing 5 as shown by the arrows A in FIG. 1(b). Accordingly, the heat developed by the the LEDs 2 and IC components 3 is efficiently dissipated through the external-assembly side on which the printed board 1 is being installed. The electrically insulative member 13 is preferably removed away from the portion that the metal fixture 4 is to be attached to provide direct metallic contact and enhance heat conduction. However, if the electrically insulative member 13 is sufficiently thin, the conduction of heat is possible therethrough, considerably improving the heat conduction toward the metal fixture 4. The heat dissipates to the outside through also the entire surface of the printed board 1. The effect of heat dissipation is satisfactorily available in the abovestated cases.

Figure 3:
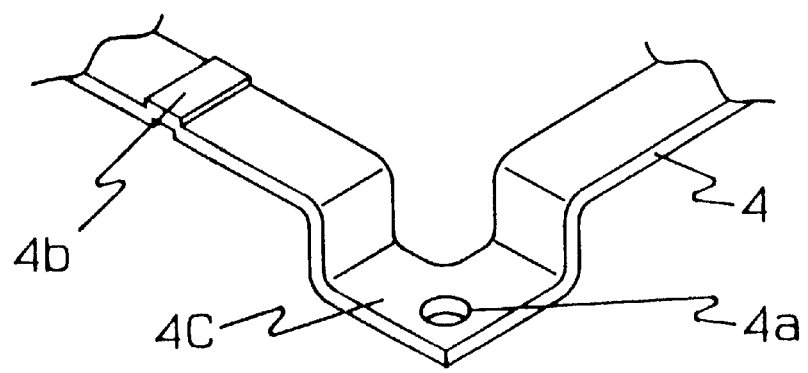
FIG. 3 is a partial perspective view of another example of a metal fixture of the display apparatus of the present invention.

Referring to FIG. 3, there is shown another example of the metal fixture having a thickness of approximately 1 mm or less without using a thick or bulk material thicker than the IC components. This metal fixture is fabricated through for example press-working from a sheet material or otherwise die-casting of aluminum. With this metal fixture, the removal of the electrically insulative member 13 can be done in a limited area of the peripheral portion, instead of the entire periphery. That is, in the FIG. 3 example, the metal fixture 4 is in a ring form with a thin wall thickness, which has projecting portions 4c formed high for being mounted onto a housing and stepped portions 4b for direct contact with the metal plate 11. The projecting portion 4c has such a height as to prevent against interference with the IC components, whilst the stepped portion 4b is provided such that it is placed into contact with the metal plate 11 at portions partly exposed from the insulative member 13. With such structure, it is possible to form a metal fixture with using a thinner or reduced volume of material. It is noted that, even where the removal of the insulative member 13 is limited to part of the peripheral portion, the effect of heat dissipation available is similar to the aforestated example.

As explained above, the display apparatus of the present invention employs a heat conductive substrate at least a core portion of the printed board mounting with electronic components such as LEDs. Therefore, even if there occurs heat development in the electronic components, the heat is efficiently dissipated, thereby being prevented against excessive heating of the electronic components without having effects upon brightness of light.

Thus, there is almost no fear of unnecessary heating of electronic components, so that the lifetime of these components is prolonged with a reduced rate of failure, greatly improving the reliability of the electronic apparatus.

Although preferred embodiments have been described in some detail, it is to be understood that certain changes can be made by those skilled in the art without departing from the spirit and scope of the invention as defined by the appended claims.

What is claimed is:

1. A display apparatus comprising:

a heat conductive substrate;

first and second electrically insulative members formed on respective surfaces of said heat conductive substrate;

light emitting elements arranged in a matrix form on the surface of said first electrically insulative member on one surface of said heat conductive substrate; and control components arranged on the surface of said second electrically insulative member on the other surface of said heat conductive substrate, wherein said first electrically insulative member on said one surface is formed of at least two layers, the first layer having an interconnect pattern formed on a surface thereof, the second layer being formed with blind through-holes through which said light emitting elements and said interconnect pattern are electrically connected.

2. The display apparatus of claim 1, wherein said heat conductive substrate is formed by a metal plate.

3. A display apparatus comprising:

a heat conductive substrate;

first and second electrically insulative members formed on respective surfaces of said heat conductive substrate;

light emitting elements arranged in a matrix form on the surface of said first electrically insulative member on one surface of said heat conductive substrate; and control components arranged on the surface of said second electrically insulative member on the other surface of said heat conductive substrate, wherein said second electrically insulative member on said other surface is formed of at least two layers, the first layer having an interconnect pattern formed on a surface thereof, the second layer being formed with blind through-holes through which said control components and said interconnect pattern are electrically connected.

4. A display apparatus comprising:

a heat conductive substrate;

first and second electrically insulative members formed on respective surfaces of said heat conductive substrate;

light emitting elements arranged in a matrix form on the surface of said first electrically insulative member on one surface of said heat conductive substrate; and control components arranged on the surface of said second electrically insulative member on the other surface of said heat conductive substrate, wherein at least one of said electrically insulative members are partly removed to provide exposed surface to said heat conductive substrate.

5. The display apparatus of claim 4, wherein said heat conductive substrate has a metal fixture on said other surface thereof, said metal fixture being in contact with said exposed surface of said heat conductive substrate, and said metal fixture has a height higher than those of said control components.

6. The display apparatus of claim 5, wherein said metal fixture is formed by a sheet member, and said metal fixture includes an attaching portion projecting higher than said control component.

7. The display apparatus of claim 5, wherein said sheet member has a stepped portion formed projecting to be contacted with said exposed surface of said heat conductive substrate.

* * * * *